United States Patent [19]

Valentine

[11] Patent Number: 4,806,786
[45] Date of Patent: Feb. 21, 1989

[54] EDGE SET/RESET LATCH CIRCUIT HAVING LOW DEVICE COUNT
[75] Inventor: William R. Valentine, Austin, Tex.
[73] Assignee: Motorola, Inc., Schaumburg, Ill.
[21] Appl. No.: 115,953
[22] Filed: Nov. 2, 1987
[51] Int. Cl.$^4$ .................. H03K 3/26; H03K 3/284; H03K 17/16
[52] U.S. Cl. .................. 307/279; 307/443; 307/448; 307/451; 307/272.1
[58] Field of Search .............. 307/443, 448, 451, 279, 307/272 A

[56] References Cited
FOREIGN PATENT DOCUMENTS

| 2343128 | 8/1972 | Fed. Rep. of Germany | 307/279 |
| 0036220 | 4/1981 | Japan | 307/279 |
| 0134622 | 7/1985 | Japan | 307/279 |

Primary Examiner—John Zazworsky
Assistant Examiner—M. R. Wambach
Attorney, Agent, or Firm—Robert L. King

[57] ABSTRACT

A latch circuit is provided which may be set to a predetermined logic state in response to a positive transitioning edge of a set signal and reset to an opposite logic state in response to a negative transitioning edge of a rest signal. A master circuit portion receives the set and reset signals and provides a control signal in response to the set and reset signals and the output signal. A slave circuit portion receives the control signal and provides the output signal in response to the control signal and the set and reset signals. By multiplexing set and reset enabling functions with common circuitry, a reduced amount of circuitry is required.

8 Claims, 2 Drawing Sheets 4,806,786

EDGE SET/RESET LATCH CIRCUIT HAVING LOW DEVICE COUNT

TECHNICAL FIELD

This invention generally relates to bistable logic circuitry, and more particularly, to edge triggered latch circuits.

BACKGROUND ART

Applications and advantages of a set/reset latch circuit are well known. For example, latch circuits may be used to implement timing and control functions or to store outputs which are to be delayed. In some applications, an edge set/reset latch circuit may be more useful than a level sensitive set/reset latch circuit which functions in response to a predetermined signal level rather than in response to the transition of a signal edge. The output of an edge set/reset latch circuit will respond to a first input signal applied to a first input thereof as the first input signal becomes active even if a second input signal applied to a second input of the latch circuit is at a logic high level (i.e. active). In contrast, a level sensitive set/reset latch circuit typically defaults to a standby condition if signals at both inputs of the latch circuit become active during the same time period.

Edge sensitive set/reset latch circuits have been implemented with three memory storage circuits, such as three D-type flip flop circuits, and some additional logic circuitry. As a result, an edge sensitive set/reset latch circuit is typically much larger in size than a level sensitive set/reset latch circuit. In applications which require a plurality of set/reset latch circuits, edge sensitive set/reset latch circuits usually require too much circuit size so that a level sensitive set/reset latch circuit with less desirable circuit characteristics must be used.

BRIEF DESCRIPTION OF THE INVENTION

Accordingly, an object of the present invention is to provide an improved small sized edge set/reset latch circuit.

Another object of the present invention is to provide an improved edge set/reset latch circuit which minimizes transistor count.

Yet another object of this invention is to provide an improved logic circuit.

In carrying out the above and other objects of the present invention, there is provided, in one form, a latch circuit for setting an output signal to a predetermined logic state in response to an edge transition of a set signal and for resetting the output signal to an opposite logic state in response to an edge transition of a reset signal. A first circuit portion is provided for receiving the set and reset signals and provides a control signal in response to the set and reset signals and the output signal. A second circuit portion is coupled to the first circuit portion and is adapted to also receive the set and reset signals. The second circuit portion provides the output signal in response to the combination of the set and reset signals and the control signal provided by the first circuit portion.

These and other objects, features and advantages will be more clearly understood from the following detailed description taken in conjunction with the accompanying drawings.

DETAILED DESCRIPTION OF THE INVENTION

Figure 1:
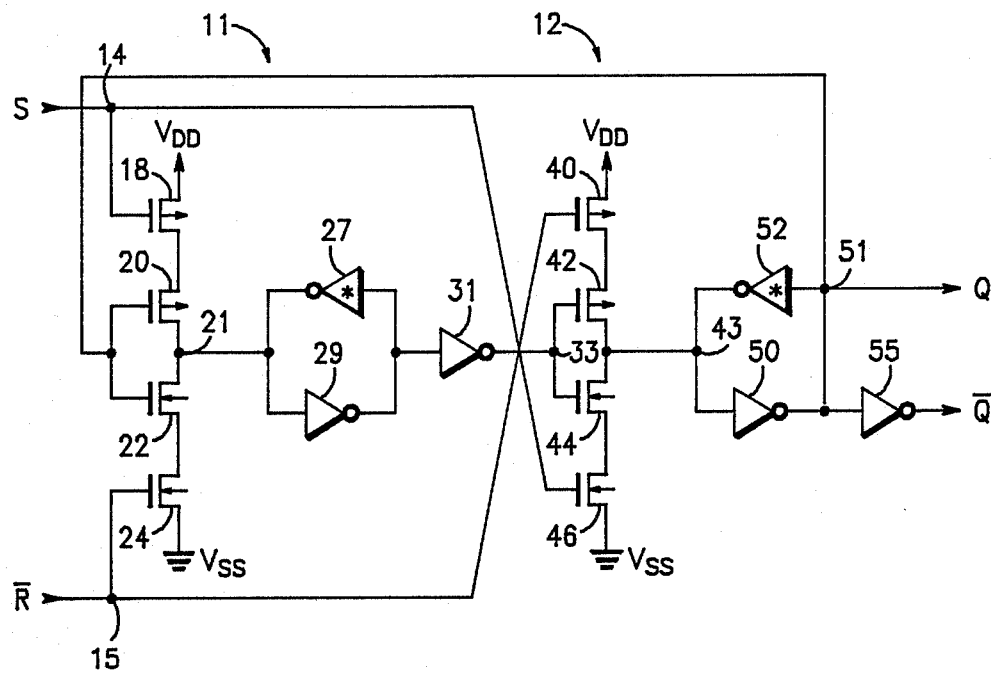
FIG. 1 illustrates in partially schematic form an edge triggered latch circuit in accordance with the present invention.

Shown in FIG. 1 is an edge triggered latch circuit 10 generally comprising a master portion 11 and a slave portion 12. While specific N-channel and P-channel MOS devices are shown, it should be clear that latch circuit 10 could be implemented by completely reversing the processing techniques (e.g. P-channel to N-channel) or by using other types of transistors.

Master portion 11 comprises an input terminal 14 for receiving a set signal labeled "S" and an input terminal 15 for receiving a complement of a reset signal labeled "$\overline{R}$". A P-channel transistor 18 has a gate connected to input terminal 14, a source connected to a power supply terminal for receiving a power supply voltage $V_{DD}$, and a drain. A P-channel transistor 20 has a source connected to the drain of transistor 18, a drain connected to a node 21, and a gate. An N-channel transistor 22 has a drain connected to the drain of transistor 20 at node 21, a gate connected to the gate of transistor 20, and a source. An N-channel transistor 24 has a drain connected to the source of transistor 22, a gate connected to input terminal 15, and a source connected to a power supply terminal for receiving a power supply voltage $V_{SS}$. In the illustrated form, power supply voltage $V_{DD}$ is more positive than power supply voltage SS. An output of a weak inverter 27 is connected to node 21 and to an input of an inverter 29. Inverter 29 has an output connected to an input of weak inverter 27 and to an input of an inverter 31.

Slave portion 12 comprises an input terminal 33 connected to an output of inverter 31. A P-channel transistor 40 has a source connected to a terminal for receiving power supply voltage $V_{DD}$, a gate connected to input terminal 15 for receiving the complement of reset signal R, and a drain connected to a source of P-channel transistor 42. A gate of transistor 42 is connected to input terminal 33 and to a gate of an N-channel transistor 44. A drain of transistor 42 is connected to a drain of transistor 44 at a node 43. A source of transistor 44 is connected to a drain of an N-channel transistor 46. A gate of transistor 46 is connected to the set signal S at input terminal 14. A source of transistor 46 is connected to a terminal for receiving power supply voltage $V_{SS}$. An inverter 50 has an input connected to the source of transistor 42 at node 43, and has an output connected to a node 51 for providing an output signal labeled "Q". An input of a weak inverter 52 is connected to node 51, and an output of weak inverter 52 is connected to node 43. The output of inverter 50 is also connected to the gates of transistors 20 and 22. An inverter 55 has an input connected to the output of inverter 50 and an output for providing the complement output signal $\overline{Q}$.

In operation, latch circuit 10 functions to set the Q output to a predetermined logic level in response to a low to high edge transition of the set signal S and to reset the Q output to an opposite logic level in response to a high to low edge transition of the complement reset signal $\overline{R}$ Assume initially that the output signal Q has previously been set to a logic one state. In master portion 11, transistors 20 and 22 function as enable transistors, transistor 18 functions as a set transistor and transistor 24 functions as a reset transistor. Therefore, transistor 20 is made nonconductive and transistor 22 is made conductive by output signal Q. The net effect of the output signal condition is to totally disable the set signal S from influencing the operation of latch circuit 10. Under the described signal conditions, only the complement reset signal $\overline{R}$ is capable of changing the output signal. Whenever the complement reset signal R transitions from a low logic level to a high logic level, transistor 24 of master portion 11 becomes conductive thereby coupling a low $V_{SS}$ logic level to node 21. Inverter 29 and weak inverter 27 function as a memory element to maintain node 21 at a predetermined logic state. Weak inverter 27 operates in the same manner as inverter 29 with the exception that when an input signal is applied to node 21, the input signal overrides the output of weak inverter 27 and is the signal which is coupled to the input of inverter 29. The low logic level at node 21 forces a low logic level at node 33 thereby making transistor 42 conductive and transistor 44 nonconductive. The complement reset signal $\overline{R}$ also disables transistor 40 of slave portion 12 in response to transitioning to a high logic level.

In slave portion 12, transistors 42 and 44 function as enable transistors in response to master portion 11 to allow either the set signal or the reset signal to influence the output at node 51. When transistor 42 is enabled by the output of inverter 31, the logic level at node 43 will transition to a high logic level whenever the complementary reset signal $\overline{R}$ transitions from a high logic level to a low logic level thereby making transistor 40 conductive. A low logic level cannot be coupled to node 43 regardless of the logic state of the set signal since master portion 11 is forcing transistor 44 to remain nonconductive. A high logic level at node 43 which is coupled from power supply voltage $V_{DD}$ via transistors 40 and 42 forces the output at node 51 to reset to a low logic level. Therefore, latch circuit 1 is reset by an edge transition of the complement reset signal $\overline{R}$.

After the Q output has been reset to a low logic level, the Q output may be set by a rising edge of the set signal S regardless of how many times the complement reset signal $\overline{R}$ transitions between logic levels. The reason that the complement reset signal $\overline{R}$ does not affect the output of latch circuit 10 is that the low logic level output signal at node 51 disables transistor 22. Transistor 22 will remain disabled until latch circuit 10 is set to a logic high output. Transistors 18 and 20 couple a logic high level to the input of inverter 29 in response to the set signal S maintaining a low logic level. The logic high signal at the input of inverter 29 is reinforced by weak inverter 27 and provides a logic high signal at node 33, $V_{33}$, which enables transistor 44 and disables transistor 42. A logic low set signal keeps transistor 46 nonconductive. However, weak inverter 52 maintains a logic high signal at node 43 while output signal Q is at a logic low level. Should the set signal S transition to a logic high level, transistor 18 is made conductive thereby coupling a logic high level signal to node 21. Near simultaneously, master portion 11 couples a high logic level signal to node 33 which disables transistor 42 and enables transistor 44. The set signal also makes transistor 46 conductive thereby coupling a logic low level signal to node 43. As a result, the output signal Q transitions to a logic high level signal.

Figure 2A:
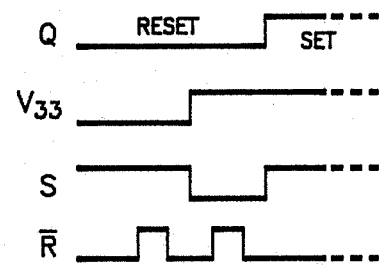
FIGS. 2(A) thru 2(E) illustrate in graphical form timing signals associated with the circuit of FIG. 1.

Shown in FIGS. 2(A) thru 2(D) are graphical illustrations of various signal conditions of latch circuit 10 described above. In FIG. 2(A), assume initially that the set signal S is at a logic high level, that the output signal has been reset and is at a logic low level. Therefore, the set signal S must transition from the high level to a low level before latch circuit 10 may be set by a rising edge of the set signal. The transition of the set signal S to a low logic level forces the voltage at node 33, $V_{33}$, to a high logic level. Transistor 42 is thereby disabled and transistor 44 enabled. Since transistor 42 is disabled, power supply voltage $V_{DD}$ cannot be coupled to node 43 to force output node 51 to a low logic level. Weak inverter 52 will maintain output node 51 at a low logic level until transistor 46 becomes conductive in response to a rising edge of set signal S. In response to the rising edge of signal S, output signal Q is set to a high logic level.

Figure 2B:
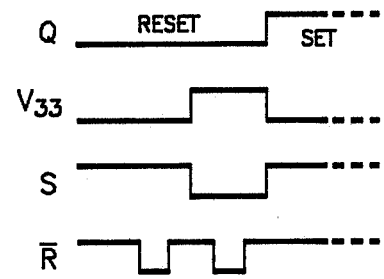

Shown in FIG. 2(B) is another signal condition which results in the setting of the output signal Q to a high logic level. As can be seen from FIGS. 2(A) and 2(B), output signal Q may be set by the set signal S regardless of the logic level of the complement reset signal R at the time of a rising edge of the set signal. Again, the reason the complement reset signal $\overline{R}$ does not influence latch circuit 10 whenever the output signal Q is at a logic low level is the fact that transistors 22 and 42 are disabled.

Figure 2C:
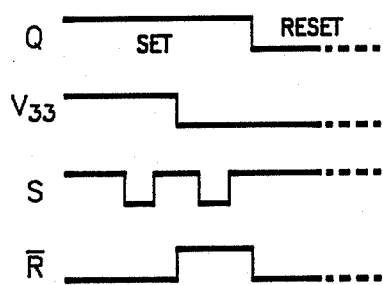
Figure 2D:
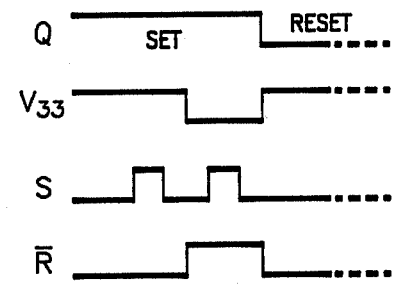

Shown in FIGS. 2(C) and 2(D) are two signal examples during resetting of latch circuit 10 from a high logic level output signal to a low logic level output signal. In both examples assume initially that the output signal Q has been set to a high logic level which disables transistor 20 and enables transistor 22. Therefore, the logic level of the voltage at node 33, $V_{33}$, is totally dependent upon the logic level of the complement reset signal, $\overline{R}$. When the complement reset signal has a logic low value, the voltage at node 33 is maintained at a logic high level regardless of the value of set signal S. Whenever the complement reset signal transitions to a logic high signal, the voltage at node 33 immediately transitions to a logic low level which disables transistor 44 and enables transistor 42. With transistor 44 being disabled, the set signal S has no influence on the output signal Q. Whenever the complementary reset signal transitions to a logic low level, the output signal Q also transitions to a logic low level and latch circuit 10 is reset. The logic low complementary reset signal makes transistor 40 conductive coupling a logic high level $V_{DD}$ voltage to node 43 which forces output node 51 to a logic low level regardless of whether the set signal S is presently at a high or low logic level. The output signal Q will remain at a logic low level until the next rising edge of the set signal.

Figure 2E:
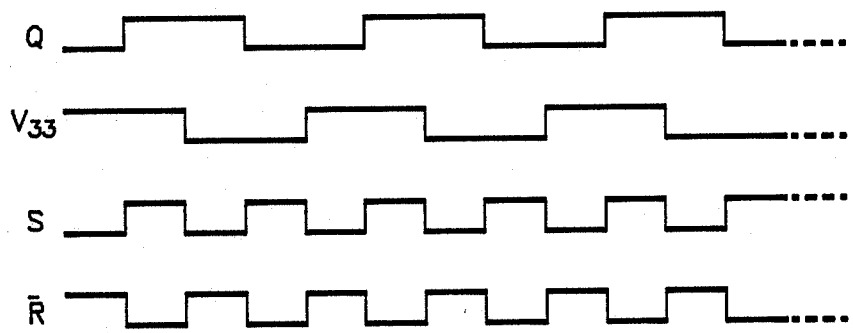

Shown in FIG. 2(E) is an illustration of the operation of latch circuit 10 in the event that the set signal and complementary reset signal try to set and reset latch circuit 10 simultaneously. In the event a rising edge of the set signal occurs at the same time as a falling edge of the complementary reset signal, the Q output signal will function by changing from a presently existing logic level to the opposite logic level. Initially assume that when the set signal is at a low logic level and the complementary reset signal is at a high logic level, the voltage at node 33 is at a high logic level due to a condition imposed by inverters 29 and 31 and weak inverter 27. Therefore, transistor 44 is enabled and transistor 42 is disabled. When the set signal transitions to a logic high level, transistor 46 is also made conductive which forces output node 51 to a logic high level thereby setting latch circuit 10. When the set signal transitions to a logic low level and the complementary reset signal transitions to a logic high level, transistors 40 and 46 are made nonconductive. Transistors 18 and 24 are made conductive and transistor 22 is conductive as a result of the logic state of output signal Q. Therefore, the voltage at node 33 is forced to transition to a logic low level which enables transistor 42 and disables transistor 44. Whenever the complementary reset signal transitions to a low logic level, the output signal Q will reset to a low logic level even though the set signal transitions to a high logic level. The operation of latch circuit 10 continues in this manner so that output signal Q will simply toggle between logic states as long as the set signal transitions to a high logic level simultaneous with the reset signal transitioning to a low logic level.

By now it should be apparent that an edge set, edge reset latch circuit which minimizes circuitry as compared with previous edge sensitive set/reset latch circuits has been provided. The present invention minimizes circuitry by multiplexing the use of the master portion 11 to detect signal levels of both the set input and the reset input as opposed to using two individual circuits or memory devices. Although circuitry is minimized, latch circuit 10 operates on edge transitions and avoids an indeterminate state whenever both a set and a reset signal are received simultaneously.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. A latch circuit using only two storage devices for setting an output signal to a predetermined logic state in response to an edge transition of a set signal and resetting the output signal to an opposite logic state in response to an edge transition of a reset signal, comprising:

first means for receiving the set and reset signals and providing a control signal having a signal level which transitions in response to an edge transition of a predetermined one of the set or reset signals depending upon a logic level of the output signal, and having a first storage device to maintain the control signal at a predetermined logic state in response to an edge transition of either the set or reset signal; and second means coupled to the first means and also receiving the set and reset signals, said second means providing the output signal in response to a combination of the set and reset signals and the control signal, and having a second storage device to maintain the output signal at a predetermined logic state until an edge transition of either the set or reset signal.

2. The latch circuit of claim 1 wherein the first means further comprise:

a first transistor of a first conductivity type having a first current electrode coupled to a first power supply voltage terminal, a control electrode for receiving the set signal, and a second current electrode;

a second transistor of the first conductivity type having a first current electrode coupled to the second current electrode of the first transistor, a control electrode coupled to the output signal, and a second current electrode;

a third transistor of a second conductivity type having a first current electrode coupled to the second current electrode of the second transistor, a control electrode coupled to the control electrode of the second transistor, and a second current electrode;

a fourth transistor of the second conductivity type having a first current electrode coupled to the second current electrode of the third transistor, a control electrode for receiving the reset signal, and a second current electrode coupled to a second power supply voltage terminal;

inverting storage means having an input coupled to the second current electrode of the second transistor, and an output; and first inverter means having an input coupled to the output of the inverting storage means and an output for providing the control signal.

3. The latch circuit of claim 2 wherein the inverting storage means comprise:

second inverter means having an input coupled to the second current electrode of the second transistor, and an output coupled to the input of the first inverter means; and third inverter means having an input coupled to the output of the second inverter means, and having an output coupled to the first input of the second inverter means, said output of the third inverter means adapted to be overridden by an input signal of opposite logic sense.

4. The latch circuit of claim 1 wherein said second means further comprise:

a first transistor of a first conductivity type having a first current electrode coupled to a first power supply voltage terminal, a control electrode for receiving the reset signal, and a second current electrode;

a second transistor of the first conductivity type having a first current electrode coupled to the second current electrode of the first transistor, a control electrode coupled to the control signal, and a second current electrode;

a third transistor of a second conductivity type having a first current electrode coupled to the second current electrode of the second transistor, a control electrode coupled to the control electrode of the second transistor, and a second current electrode;

a fourth transistor of the second conductivity type having a first current electrode coupled to the second current electrode of the third transistor, a control electrode for receiving the set signal, and a second current electrode coupled to a second power supply voltage terminal; and storage means having an input coupled to the second current electrode of the second transistor, and an output for providing the output signals.

5. A method for setting an output signal of a circuit to a predetermined logic state in response to an edge tranition of a set signal and for resetting the output signal to an opposite logic state in response to an edge transition of a reset signal, said circuti using only two storage means, comprising the steps of:

receiving the set and reset signals and the output signal with a first circuit portion;

selectively providing a control signal at an output of the first circuit portion in response to, depending upon a logic level of the output signal, either the set or reset signal using a first of the two storage means to maintain the control signal at a predetermined logic state in response to an edge transition of either the set or reset signal;

coupling the set and reset signals and the control signal to respective inputs of a second circuit portion;

selectively providing the output signal in response to the set, reset and control signals; and using a second of the two storage means to maintain the output signal at a predetermined logic state until an edge transition of either the set or reset signal.

6. An edge set/reset latch circuit, comprising:

a first transistor of a first conductivity type having a first current electrode coupled to a first power supply voltage terminal, a control electrode for receiving a set signal, and a second current electrode;

a second transistor of the first conductivity type having a first current electrode coupled to the second current electrode of the first transistor, a control electrode coupled to an output signal of the latch circuit, and a second current electrode;

a third transistor of a second conductivity type having a first current electrode coupled to the second current electrode of the second transistor, a control electrode coupled to the output signal, and a second current electrode;

a fourth transistor of the second conductivity type having a first current electrode coupled to the second current electrode of the third transistor, a control electrode for receiving a reset signal, and a second current electrode coupled to a second power supply voltage terminal;

first signal storage means having an input coupled to the second current electrode of the second transistor, and an output a fifth transistor of the first conductivity type having a first current electrode coupled to the first power supply voltage terminal, a control electrode for receiving the reset signal, and a second current electrode;

a sixth transistor of the first conductivity type having a first current electrode coupled to the second current electrode of the fifth transistor, a control electrode coupled to the output of the first signal storage means, and a second current electrode;

a seventh transistor of the second conductivity type having a first current electrode coupled to the second current electrode of the sixth transistor, a control electrode coupled to the output of the first signal storage means, and a second current electrode;

an eight transistor of the second conductivity type having a first current electrode coupled to the second current electrode of the seventh transistor, a control electrode for receiving the set signal, and a second current electrode coupled to the second power supply voltage terminal; and second signal storage means having an input coupled to the second current electrode of the sixth transistor, and an output for providing the output signal of the latch circuit.

7. The latch circuit of claim 6 wherein the first signal storage means comprises:

a first inverter having an input coupled to the second current electrode of the second transistor, and an output;

a second inverter having an input coupled to the output of the first inverter, and having an output coupled to the input of the first inverter, said output of the second inverter which can be overriden by an input signal of opposite logic sense from the second current electrode of the second transistor; and a third inverter having an input coupled to the output of the first inverter, and an output.

8. The latch circuit of claim 6 wherein the second signal storage means comprises:

a first inverter having an input coupled to the second current electrode of the sixth transistor, and an output for providing the output signal;

a second inverter having an input coupled to the output of the first inverter, and having an output coupled to the input of the first inverter, said output of the third inverter which can be overridden by an input signal of opposite logic sense; and a third inverter having an input coupled to the output of the first inverter, and an output for providing a complement of the output signal.

* * * * *